(12) United States Patent
Moon et al.

(10) Patent No.: US 9,147,858 B2
(45) Date of Patent: Sep. 29, 2015

(54) FLAT PANEL DISPLAY APPARATUS AND ORGANIC LIGHT-EMITTING DISPLAY APPARATUS

(75) Inventors: Jung-Woo Moon, Yongin (KR); Kie-Hyun Nam, Yongin (KR); Mu-Gyeom Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 104 days.

(21) Appl. No.: 13/296,683

(22) Filed: Nov. 15, 2011

(65) Prior Publication Data

US 2012/0169223 A1 Jul. 5, 2012

(30) Foreign Application Priority Data

Jan. 4, 2011 (KR) .................. 10-2011-0000547

(51) Int. Cl.
*H01L 51/52* (2006.01)
*H05K 7/00* (2006.01)

(52) U.S. Cl.
CPC ........ *H01L 51/5243* (2013.01); *H01L 51/5246* (2013.01)

(58) Field of Classification Search
CPC .............................................. H01L 51/5243
USPC .................................................. 313/495–512
See application file for complete search history.

(56) References Cited

U.S. PATENT DOCUMENTS

| | | | | |
|---|---|---|---|---|
| 5,220,444 A * | 6/1993 | Mitsui et al. | ................... | 349/113 |
| 6,420,735 B2 * | 7/2002 | Kim | ............................... | 257/95 |
| 6,617,784 B1 * | 9/2003 | Abe et al. | ....................... | 313/506 |
| 7,888,868 B2 * | 2/2011 | Kuan et al. | ..................... | 313/512 |
| 2001/0035713 A1 * | 11/2001 | Kimura | .......................... | 313/501 |
| 2002/0079828 A1 * | 6/2002 | Rha | ................................. | 313/491 |
| 2004/0189185 A1 * | 9/2004 | Yotsuya | ......................... | 313/501 |
| 2005/0230699 A1 * | 10/2005 | Wu et al. | .......................... | 257/98 |
| 2005/0231101 A1 * | 10/2005 | Chen | .............................. | 313/504 |
| 2006/0043878 A1 * | 3/2006 | Yoshii et al. | .................. | 313/497 |
| 2006/0108580 A1 * | 5/2006 | Yoshida et al. | ................. | 257/40 |
| 2007/0069222 A1 * | 3/2007 | Ko et al. | ........................... | 257/86 |
| 2008/0238302 A1 | 10/2008 | Sung et al. | | |
| 2011/0050082 A1 * | 3/2011 | Inoue et al. | ..................... | 313/483 |
| 2011/0215370 A1 * | 9/2011 | Sato et al. | ...................... | 257/103 |

FOREIGN PATENT DOCUMENTS

| | | |
|---|---|---|
| JP | 2000-267588 | 9/2000 |
| JP | 2002-231440 | 8/2002 |
| JP | 2003-257627 | 9/2003 |
| JP | 2010-181749 | 8/2010 |
| KR | 10-2002-0065125 A | 8/2002 |
| KR | 10-2003-0094917 A | 12/2003 |
| KR | 10-2008-0088031 A | 10/2008 |
| WO | WO 2009131019 A1 * 10/2009 ............. H01L 51/52 |

\* cited by examiner

*Primary Examiner* — Elmito Breval
(74) *Attorney, Agent, or Firm* — Knobbe Martens Olson & Bear LLP

(57) ABSTRACT

A flat panel display apparatus and an organic light-emitting display apparatus. The flat panel display apparatus includes: a substrate; a display unit which is disposed on the substrate to realize an image; a metal sheet which is disposed opposite to the substrate, covers at least a part of the display unit, and includes a central part at which uneven wrinkles are formed and an edge part which is formed in a flat shape in which wrinkles are not formed; and a sealing material which fills a whole space formed between the substrate and the metal sheet and seals the substrate and the metal sheet.

16 Claims, 2 Drawing Sheets

FLAT PANEL DISPLAY APPARATUS AND ORGANIC LIGHT-EMITTING DISPLAY APPARATUS

CROSS-REFERENCE TO RELATED APPLICATIONS

This application claims the benefit of Korean Patent Application No. 10-2011-0000547, filed on Jan. 4, 2011, in the Korean Intellectual Property Office, the disclosure of which is incorporated herein in its entirety by reference.

BACKGROUND

1. Field

The present invention relates to a flat panel display apparatus and an organic light-emitting display apparatus, and more particularly, to a flat panel display apparatus, which is manufactured at low material cost and in a simplified process, and an organic light-emitting display apparatus.

2. Description of the Related Technology

An organic light-emitting display apparatus is a display apparatus which includes pixel electrodes, counter electrodes, and organic light emission layers formed between the pixel electrodes and the counter electrodes. When a voltage is applied to the pixel electrodes and the counter electrodes, holes injected from the pixel electrodes are combined with electrons injected from the counter electrodes in the organic light emission layers and then become extinct, thereby forming excitations. Therefore, the organic light emission layers emit light due to energy transmitted from the excitations to the organic light emission layers so as to realize an image.

A flat panel display apparatus including such an organic light-emitting display apparatus generally encapsulates a display unit including an organic light-emitting device using a glass encapsulation substrate.

However, since the glass encapsulation substrate is to maintain a thickness to some degree to endure external stress in a manufacturing process of a display apparatus, the glass encapsulation substrate is not used to manufacture a flat panel display apparatus.

The organic light-emitting display apparatus is deteriorated by penetration of external oxygen and moisture. In order to solve this problem, the organic light-emitting device is encapsulated using an inorganic sealant such as frit. However, since such a frit encapsulation structure requires a high temperature bonding process to harden frit, the frit encapsulation structure damages the organic light-emitting device and requires a large amount of time to radiate a laser. Therefore, the frit encapsulation structure is not appropriate for a large area and its strength deteriorates.

SUMMARY OF CERTAIN INVENTIVE ASPECTS

The present invention provides a flat panel display apparatus, which is manufactured at low material cost and in a simplified process, and an organic light-emitting display apparatus.

According to an aspect of the present invention, there is provided a flat panel display apparatus including: a substrate; a display unit which is disposed on the substrate to realize an image; a metal sheet which is disposed opposite to the substrate, covers at least a part of the display unit, and includes a central part at which uneven wrinkles are formed and an edge part which is formed in a flat shape in which wrinkles are not formed; and a sealing material which fills a whole space formed between the substrate and the metal sheet and seals the substrate and the metal sheet.

Uneven wrinkles may be completely formed in an area of the metal sheet which overlaps with the display unit.

The metal sheet may include at least one material selected from the group consisting of aluminum (Al), stainless steel, Invar, copper (Cu), molybdenum (Mo), silver (Ag), tantalum (Ta), tungsten (W), titanium (Ti), and magnesium (Mg).

The sealing material may include at least one material selected from the group consisting of an epoxy-based adhesive, a silicon-based adhesive, and an acryl-based adhesive.

The flat panel display apparatus may further include a polymer layer which is disposed on a surface of the metal sheet and has a lower coefficient of thermal expansion (CTE) than a CTE of the metal sheet.

The polymer layer may include polyethyleneterephthalate (PET), polyethylenenylon (PEN), or polyimide (PI).

The flat panel display apparatus may further include a moisture absorbent which is disposed between the substrate and the metal sheet.

The moisture absorbent may include at least one material selected from the group consisting of calcium oxide (CaO), barium oxide (BaO), zeolite-based and Al-based metal complexes, and a polyacrylic acid.

The display unit may be an organic light-emitting device which includes an organic emission layer interposed between first and second electrodes.

The uneven wrinkles may be formed to non-uniform sizes.

According to another aspect of the present invention, there is provided an organic light-emitting display apparatus including: a substrate; a plurality of thin film transistors (TFTs) which are formed on the substrate and include active layers, gate electrodes, source electrodes, and drain electrodes; a plurality of organic light-emitting devices which are electrically connected to the TFTs and include organic emission layers interposed between first and second electrodes; and a metal sheet which is disposed opposite to the substrate and includes a central part at which uneven wrinkles are formed and an edge part which is formed in a flat shape in which wrinkles are not formed.

The uneven wrinkles may be formed at a part of the metal sheet facing an area of the substrate in which the TFTs and the organic light-emitting devices are formed.

The metal sheet may include at least one material selected from the group consisting of Al, stainless steel, Invar, Cu, Mo, Ag, Ta, W, Ti, and Mg.

The organic light-emitting display apparatus may further include a sealing material which fills a whole space formed between the substrate and the metal sheet and seals the substrate and the metal sheet.

The sealing material may include at least one material selected from the group consisting of an epoxy-based adhesive, a silicon-based adhesive, and an acryl-based adhesive.

The organic light-emitting display apparatus may further include a polymer layer which directly contacts a surface of the metal sheet facing the organic light-emitting device and has a lower coefficient of thermal expansion (CTE) than a CTE of the metal sheet.

The organic light-emitting display apparatus may further include a moisture absorbent which is disposed between the substrate and the metal sheet.

The organic light-emitting display apparatus may realize an image toward the substrate.

The uneven wrinkles may be formed to non-uniform sizes.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF CERTAIN INVENTIVE EMBODIMENTS

The present invention will now be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
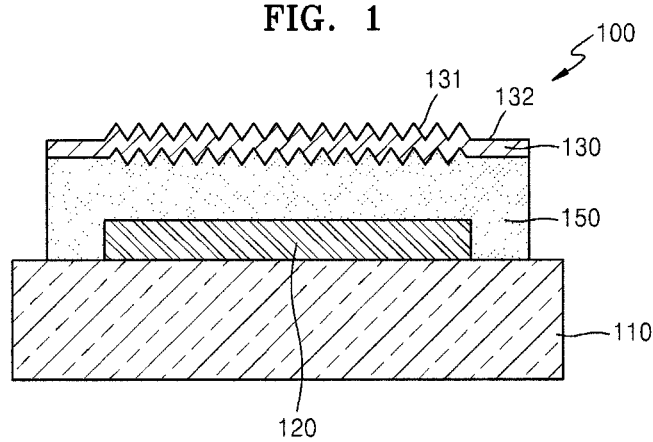
FIG. 1 is a schematic cross-sectional view illustrating a flat panel display apparatus according to an embodiment.

FIG. 1 is a schematic cross-sectional view illustrating a flat panel display apparatus 100 according to an embodiment.

Referring to FIG. 1, the flat panel display apparatus 100 includes a substrate 110, a display unit 120, a metal sheet 130, and a sealing material 150.

The substrate 110 may be a transparent glass substrate which includes silicon dioxide ($SiO_2$) as a main component, but is not limited thereto. In other words, the substrate 110 may be a transparent insulating substrate which comprises glass, quartz, ceramic, or plastic. If the substrate 110 comprises a flexible material, an application range of the flat panel display apparatus 100 increases, thereby further enhancing applicability of the flat panel display apparatus 100

The display unit 120 is formed on the substrate 110 to realize an image.

The display unit 120 may include various types of devices capable of realizing an image. For example, the display unit 120 may include an organic light-emitting device, an inorganic light-emitting device, a liquid crystal device, an electrophoretic device, or the like. The organic light-emitting device as an example of the display unit 120 will be described in more detail below with reference to FIG. 3.

The metal sheet 130 is disposed opposite to the display unit 120 as a sealing material for sealing the display unit 120 on the substrate 110. The metal sheet 130 protects the display unit 120 and prevents moisture from penetrating into the display unit 120.

The metal sheet 130 may include at least one or more metal material selected from aluminum (Al), stainless steel, Invar, copper (Cu), molybdenum (Mo), silver (Ag), tantalum (Ta), tungsten (W), titanium (Ti), and magnesium (Mg). In other words, the metal sheet 130 may comprise a metal which has a high moisture-proof and is relatively easily etched by an etchant.

Since the metal sheet 130 is formed as a thin film type sheet to a thickness of about several μm, a thin type display apparatus may be more easily realized than when using a glass substrate. The metal sheet 130 is cheaper than the glass substrate and thus reduces material cost.

The flat panel display apparatus 100 according to the present embodiment includes the metal sheet 130, at least part of which wrinkles, as will be described in more detail below.

The sealing material 150 is disposed between the substrate 110 and the metal sheet 130.

The sealing material 150 may include at least one material selected from the group consisting of an epoxy-based adhesive, a silicon-based adhesive, and an acryl-based adhesive.

In more detail, if general frit is used as the sealing material 150, a high temperature laser bonding process is required to harden the general frit, thereby damaging a display unit and requiring a considerable amount of time to radiate a laser. Therefore, the general frit is not appropriate for a large area and deteriorates the strength of the display unit. However, the sealing material 150 of the present embodiment bonds to the substrate 110 at a lower temperature than the general fit and thus prevents the display unit from deteriorating. Also, according to the present embodiment, the sealing material 150 is directly coated on the metal sheet 130 to be bonded to the substrate 110, thereby reducing a manufacturing time.

The sealing material 150 fills a whole space formed between the substrate 110 and the metal sheet 130. In other words, a sealing material of a general flat panel display apparatus is coated only at an edge of a space formed between a substrate and an encapsulant. However, the sealing material 150 of the flat panel display apparatus 100 according to the present embodiment fills the whole space formed between the substrate 110 and the metal sheet 130 and thus operates as a filler, which enhances the strength of the flat panel display apparatus 100.

Although not shown in FIG. 1, a polymer layer (not shown) is formed on a surface of the metal sheet 130 opposite to a surface of the metal sheet 130 facing the display unit 120. The polymer layer operates as a thermal buffer with respect to the metal sheet 130. The polymer layer may be directly formed on a surface of the metal sheet 130 using a laminating or printing method so as to cover the whole surface of the metal sheet 130. Here, a coefficient of thermal expansion (CTE) of the polymer layer is lower than a CTE of the metal sheet 130. The polymer layer may comprise polyethyleneterephthalate (PET), polyethylenenylon (PEN), or polyimide (PI). The polymer layer may also comprise various types of materials which have lower thermal coefficient than the metal sheet 130. The polymer layer prevents the surface of the metal sheet 130 from wrinkling due to expansion or contraction of the metal sheet 130.

Although not shown in FIG. 1, a moisture absorbent (not shown) is further disposed between the substrate 110 and the metal sheet 130.

The moisture absorbent is directly disposed on the surface of the metal sheet 130 facing the display unit 120. In more detail, the moisture absorbent may be formed to a smaller area than a whole area of the metal sheet 130. The moisture absorbent may also be directly formed on the surface of the metal sheet 130 using a laminating or printing method. The moisture absorbent may include at least one or more material selected from the group consisting of calcium oxide (CaO), barium oxide (BaO), zeolite-based and Al-based metal complexes, and a polyacrylic acid. If the moisture absorbent is further included, a flat panel display apparatus may be manufactured at low material cost and in a simplified process and may be prevented from deteriorating due to penetration of moisture.

The flat panel display apparatus 100 according to the present embodiment includes the metal sheet 130, at least part of which wrinkles, as will be described in more detail below.

A conventional flat panel display apparatus generally encapsulates a display unit using a glass encapsulation substrate. However, the glass encapsulation substrate is to maintain a thickness to some degree to endure external stress in a manufacturing process of the conventional flat panel display apparatus. Therefore, the conventional flat panel display apparatus is not manufactured as a thin type display apparatus. In order to solve this, various attempts to use cheap thin film encapsulation, reduce a thickness of a panel, etc. have been made. Among these, a method of using a metal member as an encapsulant has been developed, and a metal can-type metal member is used in a compact display apparatus to perform an encapsulation process. However, such a metal plate is too heavy to be applied to a large display apparatus and has a different CTE from a glass substrate, thereby breaking a panel.

In order to solve these problems, a method of encapsulating a large display panel using a light, thin, and cheap metal sheet has been developed. However, although such a metal sheet is used, if a temperature rises and falls due to a high basic CTE of a metal material, the metal sheet or a substrate bends. The metal sheet peels in an encapsulation structure using the metal sheet and thus reduces a blocking strength or physically damages an organic light-emitting device.

In other words, if a metal sheet is used as an encapsulant, a thermosetting adhesive is used instead of an ultraviolet (UV) hardening adhesive. Here, an adhesive is heated and hardened at a relatively high temperature to exhibit an adhesive strength. However, when bonding is performed at a high temperature, the metal sheet expands due to a higher CTE of the metal sheet than a glass substrate on which an organic light-emitting device is deposited. If the flat panel display apparatus is cooled at room temperature, the metal sheet contracts, and thus the flat panel display apparatus bends due to a contraction difference between the metal sheet and the glass substrate.

Bending of the flat panel display apparatus makes a flexible printed circuit board (FPCB) bonding process or a Polaroid film adhering process difficult to perform, and an external appearance of the flat panel display apparatus looks poor. Also, internal stress occurs, and thus the flat panel display apparatus is easily broken by an external shock.

In order to solve these problems, the flat panel display apparatus 100 according to the present embodiment includes the metal sheet 130, at least part of which wrinkles. In other words, because of the at least part of the metal sheet 130 wrinkled, and if the metal sheet 130 having the relatively high CTE expands and contracts, horizontal expansion and contraction of the metal sheet 130 is changed to vertical expansion and contraction. Therefore, stress and bending due to a difference between the CTEs of the substrate 110 formed of the glass material and the metal sheet 130 are reduced.

Here, the metal sheet 130 of the flat panel display apparatus 100 according to the present embodiment is formed to cover the display unit 120, and at least part of an area of the metal sheet 130 facing the display unit 120 wrinkles.

In more detail, areas of the metal sheet 130 may have different characteristics. For example, uneven wrinkles are formed at a central part 131 of the metal sheet 130 facing the display unit 120 to prevent the metal sheet 130 from bending. If uneven wrinkles are formed at an edge part of the metal sheet 130, the uneven wrinkles may contact the substrate 110 and thus may scratch the substrate 110. Therefore, an adhesive strength between the substrate 110 and the metal sheet 130 decreases, thereby increasing penetration of moisture. In other words, the edge part 132 of the metal sheet 130 is to have a flat surface so as to improve moisture proofness.

Therefore, the uneven wrinkles are formed at the central part 131 of the metal sheet 130 facing the display unit 120 to prevent the metal sheet 130 from bending. Also, the edge part 132 of the metal sheet 130 is formed as a plane where no uneven wrinkles are formed, to enhance the adhesive strength between the substrate 110 and the metal sheet 130, thereby improving moisture proofness.

Here, the uneven wrinkles may be irregularly formed in non-uniform sizes at the central part 131 of the metal sheet 130 to prevent the metal sheet 130 from bending.

According to the above-described embodiment, a flat panel display apparatus may be manufactured at low material cost and in a simplified process. Also, negative effects of stress on the substrate 110 due to a difference between CTEs of the metal sheet 130 and the substrate 110, e.g., physical damage to an organic light-emitting device, bending or breaking of the flat panel display apparatus 100, a weak shock-resistance characteristic, etc., are reduced.

Figure 2A:
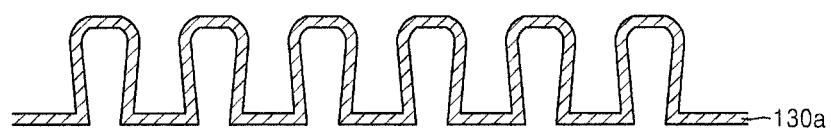
FIGS. 2A, 2B, and 2C illustrate metal sheets of the flat panel display apparatus of FIG. 1, according to embodiments.
Figure 2B:
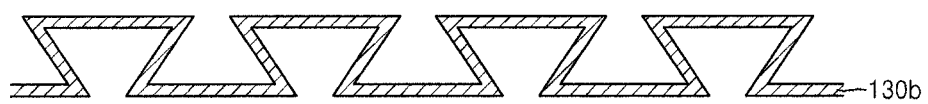
Figure 2C:
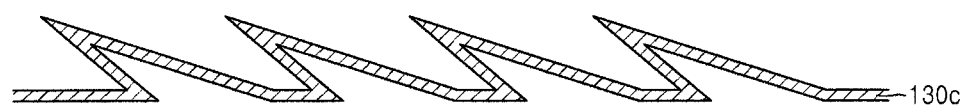

FIGS. 2A, 2B, and 2C illustrate metal sheets 131, 132, and 133 of the flat panel display apparatus 100 of FIG. 1, according to embodiments.

As shown in FIG. 2a, the metal sheet 130a of the flat panel display apparatus 100 is formed in an uneven shape having gentle curvature ends. As shown in FIG. 2B, the metal sheet 130b of the flat panel display apparatus 100 is formed in a reverse trapezoidal uneven shape. As shown in FIG. 3C, the metal sheet 130c of the flat panel display apparatus 100 is formed in a biased uneven shape. A metal sheet of the flat panel display apparatus 100 may be formed in various shapes besides the shapes described above.

Figure 3:
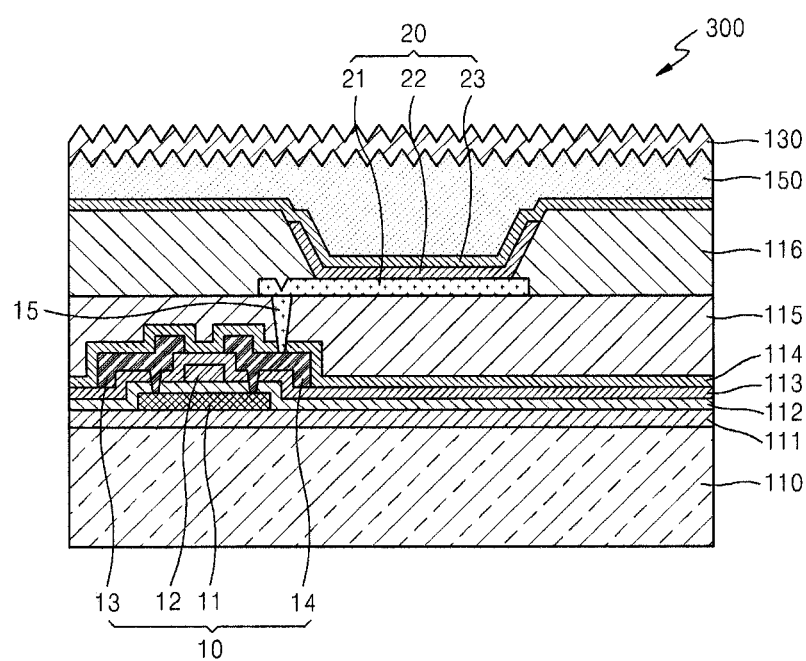
FIG. 3 is a schematic cross-sectional view illustrating a part of an organic light-emitting display apparatus according to an embodiment.

FIG. 3 is a schematic cross-sectional view illustrating a part of an organic light-emitting display apparatus 300 according to an embodiment.

Referring to FIG. 3, the organic light-emitting display apparatus 300 includes a substrate 110, an organic light-emitting device 20, a metal sheet 130, and a sealing material 150.

The substrate 110 may be a transparent glass substrate which includes $SiO_2$ as a main component, but is not limited thereto.

The organic light-emitting device 20 and a thin film transistor (TFT) 10 electrically connected to the organic light-emitting device 20 are deposited on the substrate 110. For convenience, one organic light-emitting device 20 and one TFT 10 are shown in FIG. 3. However, the organic light-emitting display apparatus 300 may include a plurality of organic light-emitting devices 20 and a plurality of TFTs 10.

The organic light-emitting display apparatus 300 may be classified into a passive matrix (PM) type display apparatus and an active matrix (AM) type display apparatus according to whether driving of the organic light-emitting device 20 is controlled by the TFT 10. The organic light-emitting display apparatus 300 according to the present embodiment may be either one of the PM and AM type display apparatuses. Hereinafter, the organic light-emitting display apparatus 300 will be described as the AM type display apparatus in more detail.

A buffer layer 111 is further formed of $SiO_2$ and/or silicon nitride (SiNx) on the substrate 110 to smooth a surface of the substrate 110 and prevent penetration of impurities into the substrate 110.

An active layer 11 of the TFT 10 comprises a semiconductor material on the buffer layer 111, and a gate insulating layer 112 is formed on the buffer layer 111 to cover the active layer 11. A gate electrode 12 is formed on the gate insulating layer 112, and an interlayer insulating layer 113 is formed on the gate insulating layer 112 to cover the gate electrode 12. A source electrode 13 and a drain electrode 14 are formed on the interlayer insulating layer 113, and a passivation layer 114 and a planarization layer 115 are sequentially formed on the interlayer insulating layer 113 to cover the source and drain electrodes 13 and 14.

The gate insulating layer 112, the interlayer insulating layer 113, the passivation layer 114, and the planarization layer 115 may be formed as insulators and may comprise inorganic materials, organic materials, or organic and/or inorganic materials in single layer structures or multi-layer structures. A stack structure of the TFT 10 is only an example, and thus TFTs having various structures may be applied.

A first electrode 21 of the organic light-emitting device 20 is formed on the planarization layer 115 as an anode electrode, and a pixel-defining layer 116 is formed on the planarization layer 115 to cover the first electrode 21. A predetermined opening is formed in the pixel-defining layer 116, and an organic emission layer 22 of the organic light-emitting device 20 is formed within an area defined by the predetermined opening. A second electrode 23 of the organic light-emitting device 20 is formed as a cathode electrode to cover all pixels. Polarities of the first and second electrodes 21 and 23 may be changed to opposite polarities to the ones stated above, that is the first and second electrodes 21 and 23 may be formed as cathode and anode electrodes, respectively.

The organic light-emitting display apparatus 300 according to the present embodiment is a backward-emitting type display apparatus which realizes an image toward the substrate 110. Therefore, the first electrode 21 may be a transparent electrode, and the second electrode 23 may be a reflective electrode.

The first electrode 21 may comprise indium tin oxide (ITO), indium zinc oxide (IZO), zinc oxide (ZnO), or indium (III) oxide (In2O3), and the second electrode 23 may comprise lithium (Li), calcium (Ca), lithium fluoride (LiF)/Ca, LiF/Al, Al, Mg, or combinations thereof.

The organic emission layer 22 may be formed between the first and second electrodes 21 and 23 of a low molecular weight organic material or a high molecular weight organic material. If the organic emission layer 22 comprises the low molecular weight organic material, a hole injection layer (HIL) (not shown), a hole transport layer (HTL) (not shown), an electron transport layer (ETL), an electron injection layer (EIL), etc. may be stacked in a single structure of a complex structure so that the organic emission layer 22 is formed among them. Copper phthalocyanine (CuPc), N,N'-di(naphthalene-1-yl)-N,N'-diphenyl-benzidine (NPB), tris-8-hydroxyquinoline aluminum (Alq3), or the like may be used an organic material. These low molecular organic materials may be formed using masks and a vacuum deposition method.

If the organic emission layer 22 comprises the high molecular weight organic material, a HTL (not shown) may be further formed from the organic emission layer 22 to the anode electrode. Here, the HTL may comprise poly(3,4-ethylenedioxythiophene) (PEDOT), and the organic emission layer 22 may comprise a poly-Phenylenevinylene (PPV)-based high molecular organic material, a polyfluorene-based high molecular organic material, or the like.

A metal sheet 130 is disposed as an encapsulant for encapsulating the organic light-emitting device 20 above the substrate 110 including the organic light-emitting device 20, wherein the metal sheet 130 is opposite to the organic light-emitting device 20.

As described above, the metal sheet 130 may include at least one or more metal material selected from Al, stainless steel, Invar, and Mg and may be formed to a thin thickness of about several μm. Therefore, the organic light-emitting display apparatus 300 may be manufactured to have a thinner thickness than when a glass substrate is used as an encapsulant, and material cost of the organic light-emitting display apparatus 300 may be reduced.

Here, the flat panel display apparatus 100 according to the previous embodiment includes the metal sheet 130, at least part of which wrinkles, and the uneven wrinkles are formed at the central part 131 of the metal sheet 130 facing the display unit 120. This has been described in detail in the previous embodiment, and thus its detailed descriptions will be omitted herein.

The sealing material 150 is disposed between the substrate 110 and the metal sheet 130 to include at least one material selected from the group consisting of an epoxy-based adhesive, a silicon-based adhesive, and an acryl-based adhesive.

As described above, in the present embodiment, the organic light-emitting device 20 is prevented from deteriorating due to radiation of a laser, and a time required for hardening frit is omitted to reduce a manufacturing time in comparison with a case where fit is used as a sealing material.

The sealing material 150 fills a whole space formed between the substrate 110 and the metal sheet 130 to operate as a filler, thereby enhancing a strength of the organic light-emitting display apparatus 300.

A polymer layer (not shown) having a lower CTE than the metal sheet 130 is directly formed on a surface of the metal sheet 130 opposite to a surface of the metal sheet 130 facing the display unit 120. The polymer layer operates as a thermal buffer with respect to the metal sheet 130 and prevents a surface of the metal sheet 130 from wrinkling due to expansion and contraction of the metal sheet 130 when hardening the sealing material 150.

A moisture absorbent is further disposed on a surface of the metal sheet 130 facing the organic emission layer 120. The moisture absorbent may include at least one material selected from the group consisting of CaO, BaO, Zeolite-based and Al-based organic metal complexes, and a polyacrylic acid. The moisture absorbent may be directly formed on the surface of the metal sheet 130 using a laminating or printing method. Therefore, the organic emission layer 20, which is weak to moisture, may be prevented from being deteriorated by moisture.

According to the above-described embodiment, a thin organic light-emitting display apparatus may be manufactured at low material cost and in a simplified process and be prevented from deteriorating due to penetration of moisture.

As described above, a flat panel display apparatus and an organic light-emitting display apparatus according to the present invention show the following effects. Since a metal sheet is formed to a thin thickness of about several μm, a flatter display is realized than when a glass substrate is used as an encapsulant. Also, the metal sheet is cheaper than the glass substrate, thereby reducing material cost. In addition, a surface of the metal sheet is prevented from wrinkling due to a difference between CTEs of the metal sheet and a substrate.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A flat panel display apparatus comprising:
a substrate;
a display unit disposed on the substrate to realize an image;
a metal sheet which is disposed opposite to the substrate, wherein the metal sheet covers at least a part of the display unit, and is wrinkled at a central part to form uneven wrinkles and is not wrinkled at an edge part to form a flat shape, and wherein the metal sheet is formed as one body and has substantially constant thickness; and a sealing material in the space between the substrate and the metal sheet that seals the substrate and the metal sheet;

a polymer layer, comprising at least one of polyethyleneterephthalate, polyethylenenylon, and polyimide, which is disposed on a surface of the metal sheet and has a lower coefficient of thermal expansion (CTE) than the CTE of the metal sheet;

wherein the uneven wrinkles overlap at least a portion of the metal sheet in a direction perpendicular to the metal sheet.

2. The flat panel display apparatus of claim 1, wherein uneven wrinkles are completely formed in an area of the metal sheet which overlaps with the display unit.

3. The flat panel display apparatus of claim 1, wherein the metal sheet comprises at least one material selected from the group consisting of aluminum (Al), stainless steel, Invar, copper (Cu), molybdenum (Mo), silver (Ag), tantalum (Ta), tungsten (W), titanium (Ti), and magnesium (Mg).

4. The flat panel display apparatus of claim 1, wherein the sealing material comprises at least one material selected from the group consisting of an epoxy-based adhesive, a silicon-based adhesive, and an acryl-based adhesive.

5. The flat panel display apparatus of claim 1, further comprising a moisture absorbent which is disposed between the substrate and the metal sheet.

6. The flat panel display apparatus of claim 5, wherein the moisture absorbent comprises at least one material selected from the group consisting of calcium oxide (CaO), barium oxide (BaO), zeolite-based and Al-based metal complexes, and a polyacrylic acid.

7. The flat panel display apparatus of claim 1, wherein the display unit is an organic light-emitting device which comprises an organic emission layer interposed between first and second electrodes.

8. The flat panel display apparatus of claim 1, wherein the uneven wrinkles are formed to non-uniform sizes.

9. An organic light-emitting display apparatus comprising:
a substrate;
a plurality of thin film transistors (TFTs) which are formed on the substrate and comprise active layers, gate electrodes, source electrodes, and drain electrodes;
a plurality of organic light-emitting devices which are electrically connected to the TFTs and comprise organic emission layers interposed between first and second electrodes; and a metal sheet which is disposed opposite to the substrate, the metal sheet being wrinkled at a central part to form uneven wrinkles and not being wrinkled at an edge part to form a flat shape, the metal sheet being formed as one body and has substantially constant thickness;

a polymer layer, comprising at least one of polyethyleneterephthalate, polyethylenenylon, and polyimide, which is disposed on a surface of the metal sheet and has a lower coefficient of thermal expansion (CTE) than the CTE of the metal sheet;

wherein the uneven wrinkles overlap at least a portion of the metal sheet in a direction perpendicular to the metal sheet.

10. The organic light-emitting display apparatus of claim 9, wherein the uneven wrinkles are formed at a part of the metal sheet facing an area of the substrate in which the TFTs and the organic light-emitting devices are formed.

11. The organic light-emitting display apparatus of claim 9, wherein the metal sheet comprises at least one material selected from the group consisting of Al, stainless steel, Invar, Cu, Mo, Ag, Ta, W, Ti, and Mg.

12. The organic light-emitting display apparatus of claim 9, further comprising a sealing material between the substrate and the metal sheet that seals the substrate and the metal sheet.

13. The organic light-emitting display apparatus of claim 12, wherein the sealing material comprises at least one material selected from the group consisting of an epoxy-based adhesive, a silicon-based adhesive, and an acryl-based adhesive.

14. The organic light-emitting display apparatus of claim 9, further comprising a moisture absorbent which is disposed between the substrate and the metal sheet.

15. The organic light-emitting display apparatus of claim 9, wherein the organic light-emitting display apparatus realizes an image toward the substrate.

16. The organic light-emitting display apparatus of claim 9, wherein the uneven wrinkles are formed to non-uniform sizes.

* * * * *